US009578266B2

(12) United States Patent
Ovsiannikov

(10) Patent No.: US 9,578,266 B2
(45) Date of Patent: *Feb. 21, 2017

(54) IMAGE SENSOR DEFECT IDENTIFICATION USING OPTICAL FLARE

(71) Applicant: Micron Technology, Inc., Boise, ID (US)

(72) Inventor: Ilia Ovsiannikov, Studio City, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/836,496

(22) Filed: Aug. 26, 2015

(65) Prior Publication Data

US 2015/0365614 A1     Dec. 17, 2015

Related U.S. Application Data

(63) Continuation of application No. 11/512,984, filed on Aug. 30, 2006, now Pat. No. 9,137,466.

(51) Int. Cl.
*H04N 7/18* (2006.01)
*H04N 5/365* (2011.01)
*H04N 5/367* (2011.01)
*H01L 27/146* (2006.01)

(52) U.S. Cl.
CPC ..... *H04N 5/3655* (2013.01); *H01L 27/14609* (2013.01); *H04N 5/367* (2013.01); *H04N 5/3675* (2013.01); *H01L 27/14601* (2013.01)

(58) Field of Classification Search
None
See application file for complete search history.

(56) References Cited

U.S. PATENT DOCUMENTS

| 6,144,778 A | 11/2000 | Beauchamp et al. |
| 6,377,702 B1 * | 4/2002 | Cooper ............... H04N 1/6077 358/522 |
| 6,683,643 B1 * | 1/2004 | Takayama ............ H04N 5/367 348/247 |

(Continued)

FOREIGN PATENT DOCUMENTS

| EP | 0986249 A2 | 3/2000 |
| EP | 1261197 A1 | 11/2002 |

(Continued)

OTHER PUBLICATIONS

"Taiwanese Application Serial No. 096131720, Office Action mailed Aug. 15, 2011", 8 pgs.
"Taiwanese Application Serial No. 096131720, Response filed Nov. 14, 2011 to Office Action mailed Aug. 15, 2011", 3 pgs.
U.S. Appl. No. 11/514,531, filed Aug. 31, 2006, Image Sensor Defect Identification Using Blurring Techniques.

*Primary Examiner* — James M Anderson, II
(74) *Attorney, Agent, or Firm* — Schwegman Lundberg & Woessner, P.A.

(57) ABSTRACT

Embodiments described herein may operate to compare an illuminance corresponding to a signal from an image sensor array (ISA) element in a production imaging system with an illuminance associated with optical flare incident to an ISA from which the ISA element is selected. The ISA element may be identified as unusable if the illuminance corresponding to the signal from the ISA element is less than the illuminance associated with the optical flare incident to the ISA.

19 Claims, 5 Drawing Sheets

(56) References Cited

U.S. PATENT DOCUMENTS

| | | | |
|---|---|---|---|
| 7,183,532 B2 | 2/2007 | Gann | |
| 7,613,329 B2 * | 11/2009 | Grewal | G09G 3/006 345/157 |
| 9,137,466 B2 | 9/2015 | Ovsiannikov | |
| 9,232,121 B2 | 1/2016 | Ovsiannikov | |
| 2002/0080253 A1 | 6/2002 | Kim | |
| 2003/0133027 A1 | 7/2003 | Itoh | |
| 2004/0189836 A1 | 9/2004 | Spears et al. | |
| 2005/0010621 A1 | 1/2005 | Pinto et al. | |
| 2005/0110801 A1 * | 5/2005 | Lin | H04N 5/272 345/620 |
| 2005/0285952 A1 * | 12/2005 | Kwon | H04N 5/20 348/234 |
| 2007/0195179 A1 | 8/2007 | Glenn et al. | |
| 2008/0055434 A1 | 3/2008 | Ovsiannikov | |
| 2008/0055601 A1 | 3/2008 | Ovsiannikov | |
| 2008/0218610 A1 * | 9/2008 | Chapman | H04N 17/002 348/246 |
| 2014/0092279 A1 | 4/2014 | Ovsiannikov | |

FOREIGN PATENT DOCUMENTS

| | | |
|---|---|---|
| TW | 453110 B | 9/2001 |
| TW | 501365 B | 9/2002 |
| TW | I220360 B | 8/2004 |
| TW | I363179 | 5/2012 |
| WO | WO-2008027475 A2 | 3/2008 |
| WO | WO-2008027475 A3 | 8/2008 |

* cited by examiner

IMAGE SENSOR DEFECT IDENTIFICATION USING OPTICAL FLARE

PRIORITY APPLICATION

This application is a continuation of U.S. application Ser. No. 11/512,984, filed Aug. 30, 2006, which is incorporated herein by reference in its entirety.

TECHNICAL FIELD

Various embodiments described herein relate to apparatus, systems, and methods associated with imaging and image sensor arrays.

BACKGROUND INFORMATION

Image sensors are widely used in a variety of consumer electronic devices, including digital cameras and cellular telephones with built-in digital cameras. An image sensor may comprise a matrix of sensor elements. Because unusable image sensor elements may sometimes be compensated for, identification of unusable image sensor elements may increase manufacturing yield and lower production costs.

Unusable sensor elements may include "bright defects" and "dark defects." Some bright and dark defects may be of a "stuck pixel" variety. That is, an output signal from a stuck sensor element may register a fixed signal level regardless of the brightness of light incident to the element. "Brightness of light" may hereinafter be referred to using the more precise term, "illuminance." Units of lux, or lumens per square meter, may be used as a measure of illuminance.

An image sensor may convert light to analog sensor element output signals. An analog to digital converter (ADC) may convert the sensor element output signals to a digital format. A least significant bit (LSB) associated with the ADC may establish a granularity with which illuminance sensed by the sensor element may be measured. Thus, in the field of digital imaging, illuminance may be expressed in LSB units.

A dark defect may also result from a dust particle lodged adjacent to the sensor element. The dust particle may block some or all of the light that might otherwise impinge on the sensor element. If all light is blocked, the sensor element output signal may remain fixed as the illuminance incident to the sensor element changes. If the incident light is only partially blocked, and the partially-blocked sensor element is not stuck, the element output signal may vary as the incident illuminance varies. In the latter case, however, the output signal may not be as large as if the sensor element were not partially blocked.

Current methods may identify unusable sensor elements at a production facility following fabrication. Each production sensor may be tested and calibrated under controlled conditions. Such methods may incur substantial cost, and may fail to identify dark defects resulting from dust particles.

Consider, for example, a cellular telephone with a built-in camera. The camera sensor may have been tested and calibrated at the semiconductor manufacturing facility, following fabrication and before shipment to a cellular telephone manufacturer. During camera module assembly, a dust particle inside the camera module may break free and land on the surface of one or more sensor elements. The resulting dark defect may subsequently manifest itself as a cluster of dark pixels on captured images. Thus, there is a need to identify and rectify such defects.

DETAILED DESCRIPTION

Figure 1:
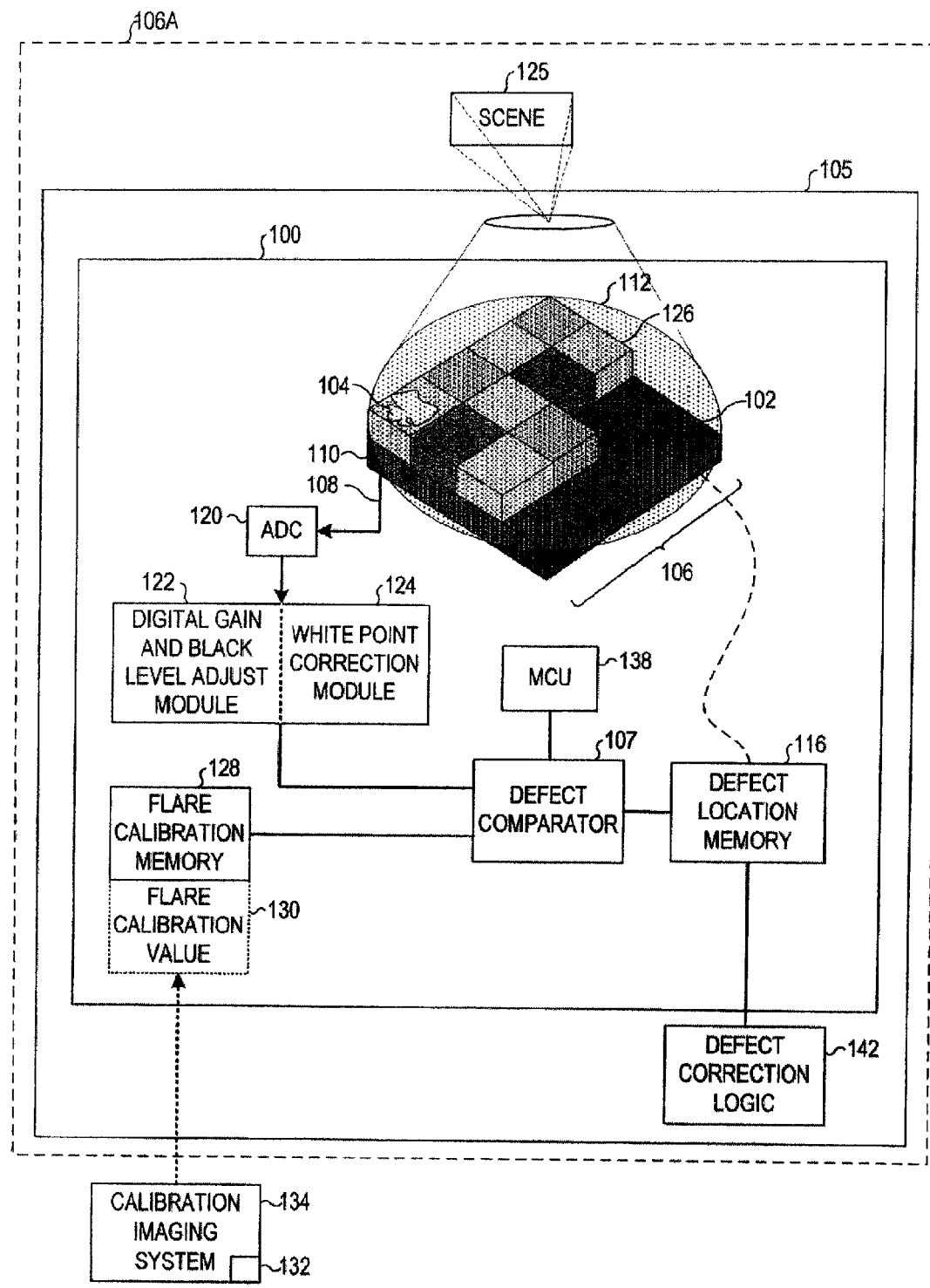
FIG. 1 is a block diagram of an apparatus according to various embodiments of the invention.

FIG. 1 is a block diagram of an apparatus 100 according to various embodiments of the invention. Many of the embodiments described herein may operate to automatically identify one or more unusable image sensor array (ISA) elements 102, including clusters thereof.

An unusable ISA element may be of a stuck pixel variety, characterized by an output level that is unchanging as the illuminance incident to the stuck pixel changes, in situations similar to those previously described. A darkly defective ISA element that is not of the stuck pixel variety may be occluded by dust particles (e.g., a dust particle 104). The dust particle 104 may fall on and lodge adjacent to the darkly defective ISA element. This may occur during or after assembly of a production digital camera or other imaging system containing an ISA, such as a production imaging system 105 comprising an ISA 106, for example. The unusable ISA elements 102 and other ISA elements described herein as unusable may comprise stuck pixel dark defects or occluded elements. Some of the embodiments disclosed herein may operate to identify unusable ISA elements "on-the-fly" during normal imaging system use.

Although example embodiments may be described herein in the context of a digital camera, embodiments of the invention may be found in other image sensor-based apparatus, systems, and applications, including cellular telephones, hand-held computers, laptop computers, desktop computers, automobiles, household appliances, medical equipment, point-of-sale equipment, and image recognition equipment, among others, collectively shown as a system 106A.

The apparatus 100 may include a defect comparator 107. The defect comparator 107 may compare an illuminance corresponding to a signal 108 from an ISA element 110 in the production imaging system 105 with an illuminance associated with optical flare 112. The optical flare 112 may be incident to the ISA 106 from which the ISA element 110 is selected. The optical flare 112 may be caused by lenses with poor quality optical surfaces and/or reflections from the ISA 106. The optical flare 112 may manifest itself as a diffuse light falling on the ISA 106, and may add a foggy illuminance offset to an image, causing the image to appear whitish and lacking contrast.

Figure 2:
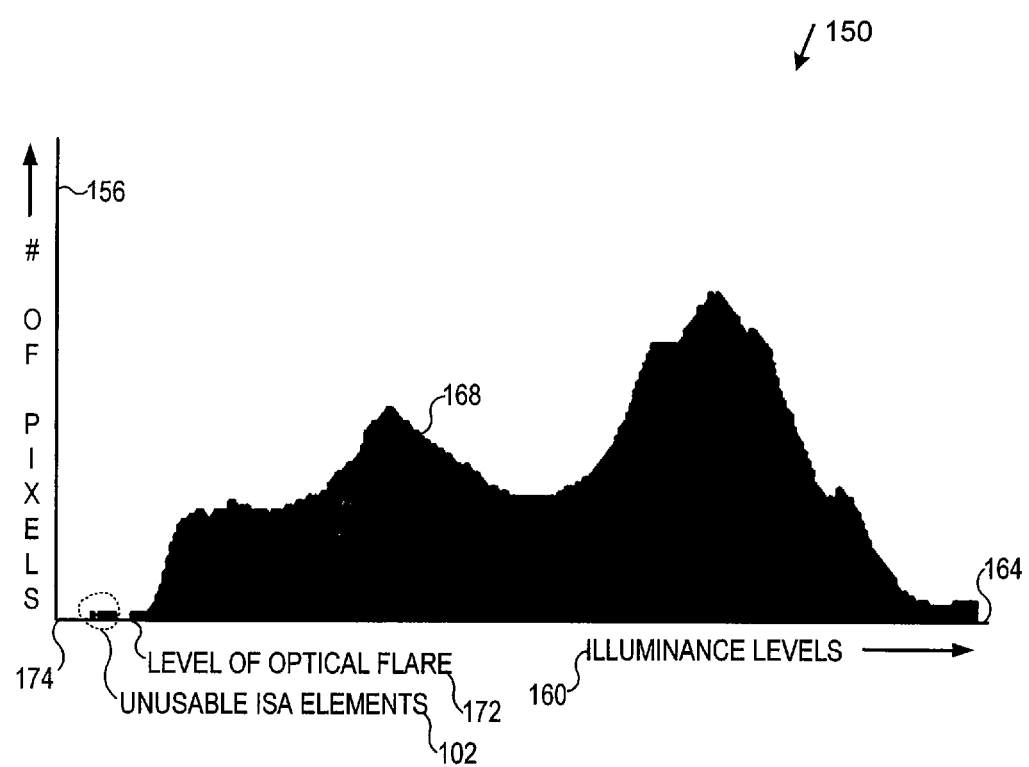
FIG. 2 is a sample histogram according to various embodiments of the invention.

FIG. 2 is a sample histogram 150 according to various embodiments of the invention. The histogram 150 may be associated with an image captured by the production imaging system 105. The vertical axis 156 may represent a number of pixels associated with each of a number of illuminance levels 160. The horizontal axis 164 may spread the illuminance levels 160 from left to right in an order of increasing illuminance. The breadth and gradation of the illuminance levels 160 may correspond to a dynamic range of illuminance associated with the production imaging system 105.

The illuminance offset caused by the optical flare 112 may shift the body 168 of the histogram to the right, to higher levels of illuminance. An illuminance level 172 associated with the optical flare 112 may correspond to an illuminance level to which a zero illuminance level 174 associated with black has been shifted as a result of the optical flare 112. Some embodiments herein may detect the unusable sensor elements 102 as sensor elements whose output signals correspond to illuminance levels below the level of flare 172. That is, a pixel blacker than a level of black as shifted by flare may be unusable.

Turning back to FIG. 1, the apparatus 100 may include a defect location memory 116 coupled to the defect comparator 107. The defect location memory 116 may tag the ISA element 110 as unusable by storing a reference to a location of the ISA element 110 in the defect location memory 116. The ISA element 110 may be so tagged if the illuminance corresponding to the signal 108 from the ISA element 110 is less than the illuminance associated with the optical flare 112 incident to the ISA 106, for example.

The apparatus 100 may further include an ADC 120 coupled to the ISA 106. The ADC 120 may digitize the signal 108 from the ISA element 110.

A digital gain and black level adjustment module 122 may be coupled to the ADC 120. The digital gain and black level adjustment module 122 may perform a black level calibration on the digitized signal from the ISA element 110. Thus calibrated, the digitized signal from the ISA element 110 may correspond to a level of zero illuminance when no light is incident to the ISA element 110.

A white point correction module 124 may also be coupled to the ISA 106. The white point correction module 124 may normalize the digitized signal from the ISA element 110 by removing a color cast introduced by illuminating the scene 125 using light of a particular color temperature. Achromatic objects may appear gray rather than tinted in a captured image as a result of a white point correction operation. The white point correction module 124 may also remove a colored component of the optical flare 112 incident to the ISA 110.

The apparatus 100 may also include a flare calibration memory 128 coupled to the defect comparator 107. The flare calibration memory 128 may store a flare calibration value 130. The flare calibration value 130 may be representative of a level of the flare 112 in the production imaging system 105. The flare calibration value 130 may correspond to a magnitude of a signal from a calibration ISA element 132 associated with a calibration imaging system 134. That is, the illuminance associated with the optical flare 112 incident to the ISA 106 may be proportional to the magnitude of the signal from the calibration ISA element 132, as further described below.

The apparatus 100 may further include a microcontroller unit (MCU) 138 coupled to the defect comparator 107. The MCU 138 may comprise an application-specific integrated circuit, a digital signal processor, or both, and may identify the unusable ISA elements 102. Defect correction logic 142 may adjust the captured image to compensate for the unusable ISA elements 102. Various techniques may exist for adjusting the captured image to compensate for the unusable ISA elements 102. For example, an illuminance value associated with an ISA element adjacent to the unusable ISA elements 102 may be substituted into captured image pixel locations corresponding to the unusable ISA elements 102.

Figure 3:
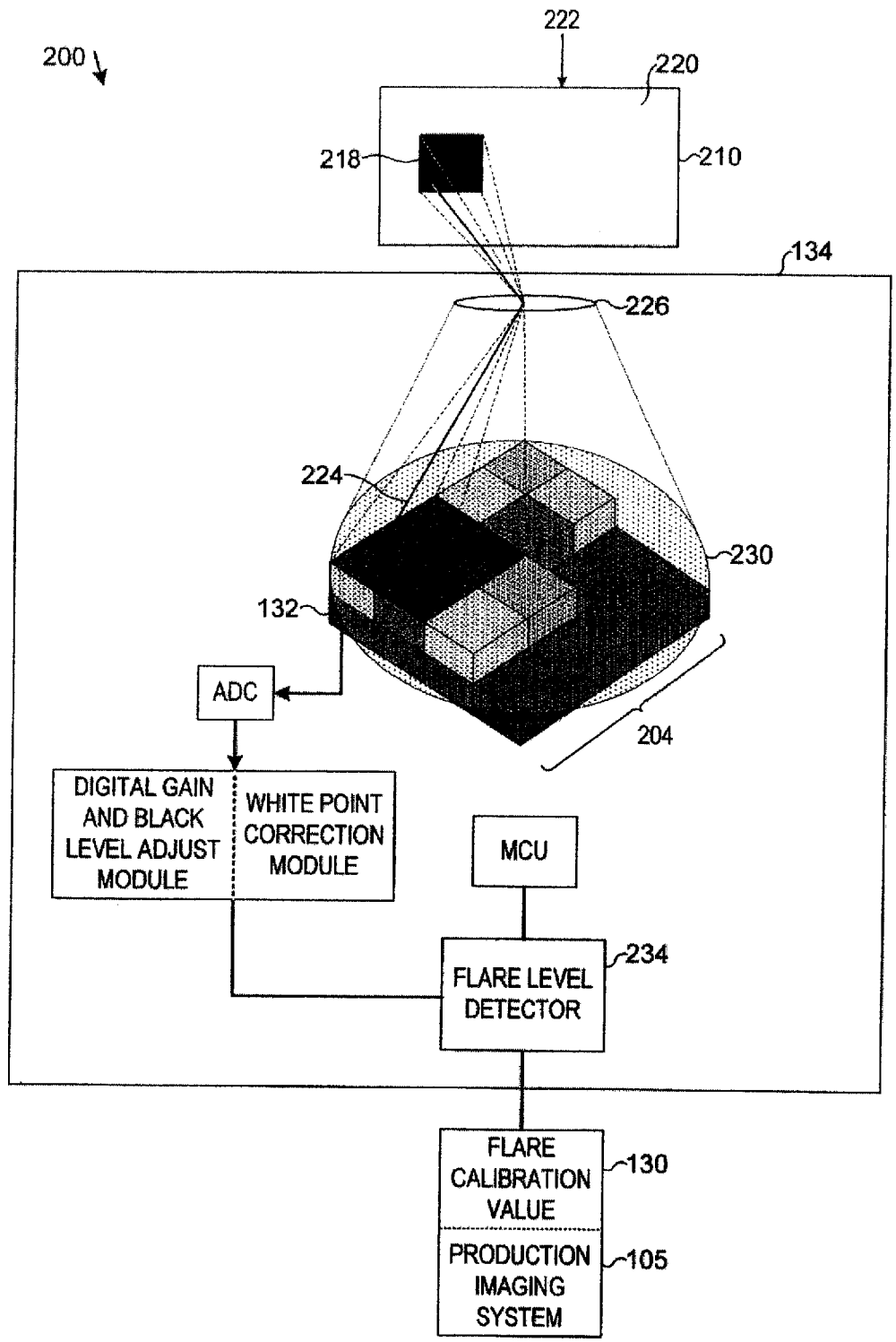
FIG. 3 is a block diagram of a representative system according to various embodiments of the invention.

FIG. 3 is a block diagram of a representative system 200 according to various embodiments of the invention. The system 200 may include one or more of the apparatus 100. The system 200 may also include the calibration imaging system 134. In some embodiments, the calibration imaging system 134 may comprise a calibration digital camera. The calibration imaging system 134 may include a calibration ISA 204 that is substantially free of bright and dark pixel defects.

The calibration imaging system 134 may image a controlled calibration scene 210. The controlled calibration scene 210 may comprise a dark area 218 reflecting substantially zero illuminance and a light area 220. An illuminance 222 incident to the light area 220 may be adjusted to control an average illuminance associated with an as-imaged version of the controlled calibration scene 210.

A set of optical ray paths 224 from the dark area 218 may traverse a lens system 226 associated with the calibration imaging system 134. The optical ray paths 224 may terminate at confluent points across the surface of the calibration ISA element 132. Thus, the set of optical ray paths 224 may provide substantially zero illuminance to the calibration ISA element 132. Therefore, the magnitude of the signal from the calibration ISA element 132 might be expected to correspond to the lowest level of brightness supported by the dynamic range associated with the calibration imaging system 134.

Assume that the magnitude of the signal from the calibration ISA element 132 corresponding to the lowest level of brightness supported by the dynamic range of the calibration imaging system 134 is zero. Consider, however, that optical flare 230 may be associated with the calibration imaging system 134. A non-zero signal from the calibration ISA element 132 may result from the optical flare 230 as the calibration ISA element 132 images the dark area 218 of the controlled calibration scene 210. A flare level detector 234 may detect and store a digitized version of the non-zero signal from the calibration ISA element 132 as the flare calibration value 130.

The design of the lens system 226 associated with the calibration imaging system 134 may be substantially identical to a design of a lens system associated with the production imaging system 105. Optical flare may originate largely in a lens and/or as a reflection from an ISA associated with an imaging system. Thus, the optical flare 112 incident to the ISA 106 in the production imaging system 105 may be proportional to the magnitude of the signal from the calibration ISA element 132. That is, substantially identical levels of flare may be expected in imaging systems utilizing the same lens system and/or ISA.

Any of the components previously described may be implemented in a number of ways, including embodiments in software. Such embodiments may be used in simulation systems, for example. Thus, the apparatus 100; the ISA elements 102, 110, 132; the dust particle 104; the imaging systems 105, 134; the ISAs 106, 204; the system 106A, the defect comparator 107; the signal 108; the optical flare 112, 230; the defect location memory 116; the ADC 120; the digital gain and black level adjustment module 122; the white point correction module 124; the scenes 125, 210; the color filter 126; the flare calibration memory 128; the flare calibration value 130; the MCU 138; the defect correction logic 142; the histogram 150; the axes 156, 164; the illuminance levels 160, 172, 174; the histogram body 168; the system 200; the dark area 218; the light area 220; the illuminance 222; the optical ray paths 224; the lens system 226; and the flare level detector 234 may all be characterized as "modules" herein.

The modules may include hardware circuitry, single or multi-processor circuits, memory circuits, software program modules and objects, firmware, and combinations thereof, as desired by the architect of the apparatus 100 and the system 200 and as appropriate for particular implementations of various embodiments.

The apparatus and systems of various embodiments may be useful in applications other than identifying unusable image sensor elements. Thus, various embodiments of the invention are not to be so limited. The illustrations of the apparatus 100 and the system 200 are intended to provide a general understanding of the structure of various embodiments. They are not intended to serve as a complete description of all the elements and features of apparatus and systems that might make use of the structures described herein.

The novel apparatus and systems of various embodiments may comprise and/or be included in electronic circuitry used in high-speed computers, communication and signal processing circuitry, single or multi-processor modules, single or multiple embedded processors, multi-core processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 4:
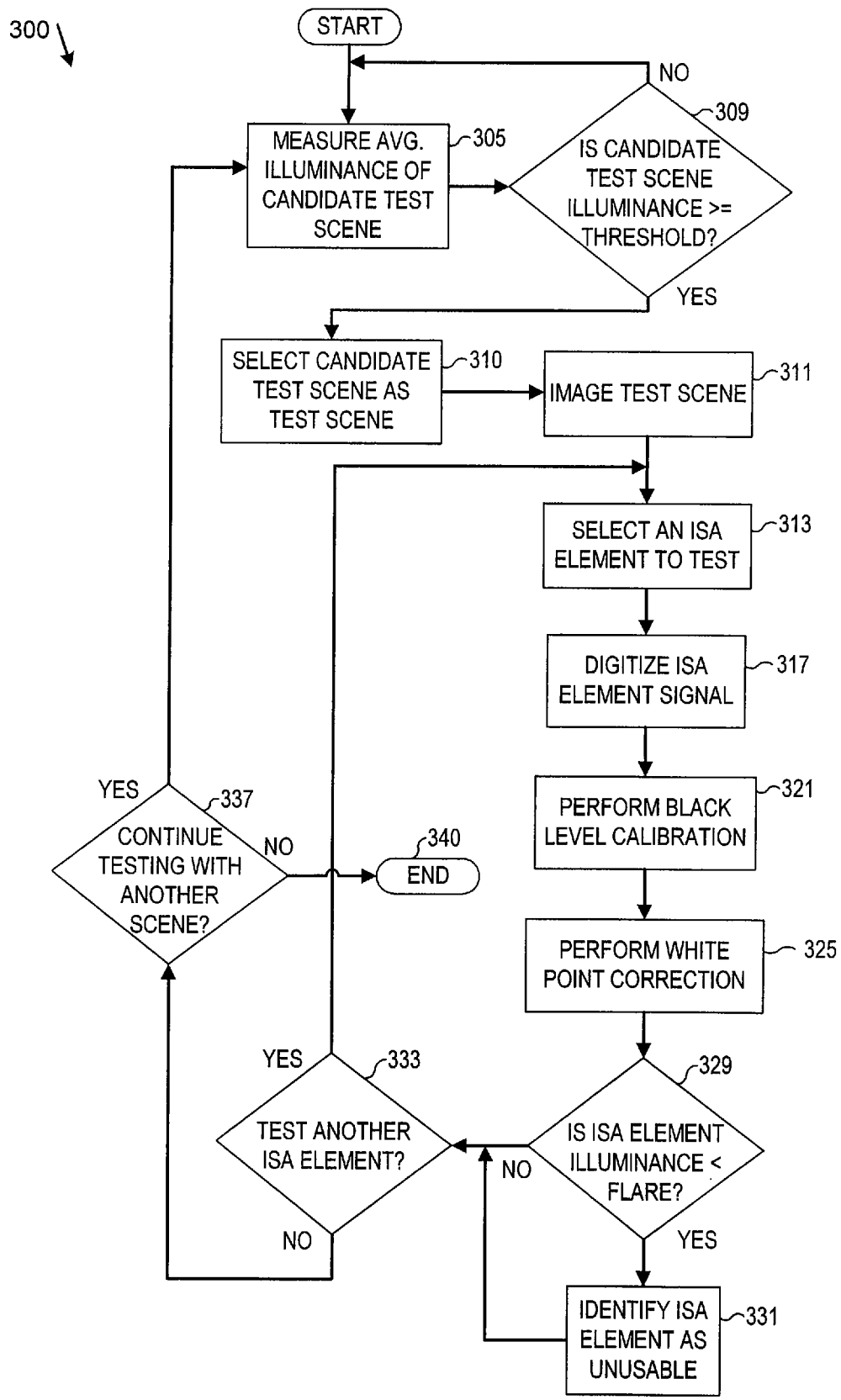
FIG. 4 is a flow diagram illustrating several methods according to various embodiments of the invention.

FIG. 4 is a flow diagram illustrating several methods according to various embodiments of the invention. A method 300 may use optical flare associated with a lens in a production imaging system to identify an unusable ISA element associated with an ISA in the production imaging system. In some embodiments, the production imaging system may be configured as a production digital camera. Unusable ISA element identification may occur during normal operation of the production imaging system.

The method 300 may begin at block 305 with measuring an average illuminance associated with one or more candidate test scenes as the production imaging system is pointed toward the candidate test scenes. The average illuminance may be equal to an average of pixel values in the candidate test scene. The pixel values may be expressed in units of LSBs. For example, an end-user of a cellular telephone with a built-in camera may use the camera to capture images by pointing the camera at a variety of scenes. The method 300 may select one or more of such scenes as the candidate test scenes.

An illuminance associated with a dark scene may be insufficient to create a level of lens flare sufficient to achieve a desired level of consistency in the detection method 300. The method 300 may thus continue at block 309 with determining whether an average illuminance associated with the candidate test scene is greater than or equal to a threshold illuminance. If not, the method 300 may return to block 305 to select another candidate test scene to test for adequate illuminance. If the average illuminance associated with the candidate test scene is greater than or equal to the threshold illuminance, the method 300 may select the candidate test scene as a test scene to be further analyzed, at block 310.

Continuing with the previous example, the method 300 may wait to select, image, and analyze a test scene until the end-user serendipitously points the cellular telephone camera at a candidate test scene with an average illuminance greater than or equal to the threshold illuminance.

If the average illuminance associated with the test scene is sufficient, as described above, the method 300 may include imaging the test scene, at block 311. The method 300 may also include selecting an ISA element to test, at block 313, and digitizing a signal from the ISA element, at block 317. The method 300 may continue at block 321 with performing a black level calibration on the digitized signal from the ISA element. Following the black level calibration, the digitized signal from the ISA element may correspond to a level of zero illuminance when no light is incident to the ISA element.

The method 300 may also include performing a white-point correction operation to normalize the digitized signal from the ISA element, at block 325. The white-point correction operation may remove a color cast introduced by illuminating the scene with light of a particular color temperature. Achromatic objects may appear gray rather than tinted in a captured image as a result of a white-point correction operation. The white point correction operation may also remove a colored component of the lens flare.

The method 300 may proceed with comparing an illuminance corresponding to the signal from the ISA element with an illuminance associated with optical flare incident to the ISA from which the ISA element is selected, at block 329. If the illuminance corresponding to the signal from the ISA element is less than the optical flare incident to the ISA, the method 300 may include identifying the ISA element as unusable, at block 331.

A calibration imaging system may be configured such that the illuminance associated with the optical flare incident to the ISA is proportional to the magnitude of a signal previously obtained from a calibration ISA element associated with the calibration imaging system, as further described below. Thus, in some embodiments, block 329 may compare the magnitude of the signal from the ISA element in the production imaging system to the magnitude of the signal from the calibration ISA element in the calibration imaging system.

The method 300 may determine whether additional ISA elements are to be tested, at block 333. If so, the method 300 may continue at block 313. If no additional ISA elements are to be tested for the selected scene, the method 300 may determine whether ISA element testing is to be continued using another scene, at block 337. If so, the method 300 may continue at block 305. If not, the method 300 may terminate at block 340. Using this technique, the production imaging system, or other imaging device, may operate to confirm that an identified ISA element is unusable by repeating tests as the device is pointed at a variety of scenes. Optionally, imaging system exposure times may be temporarily increased to achieve sufficient illuminance.

Figure 5:
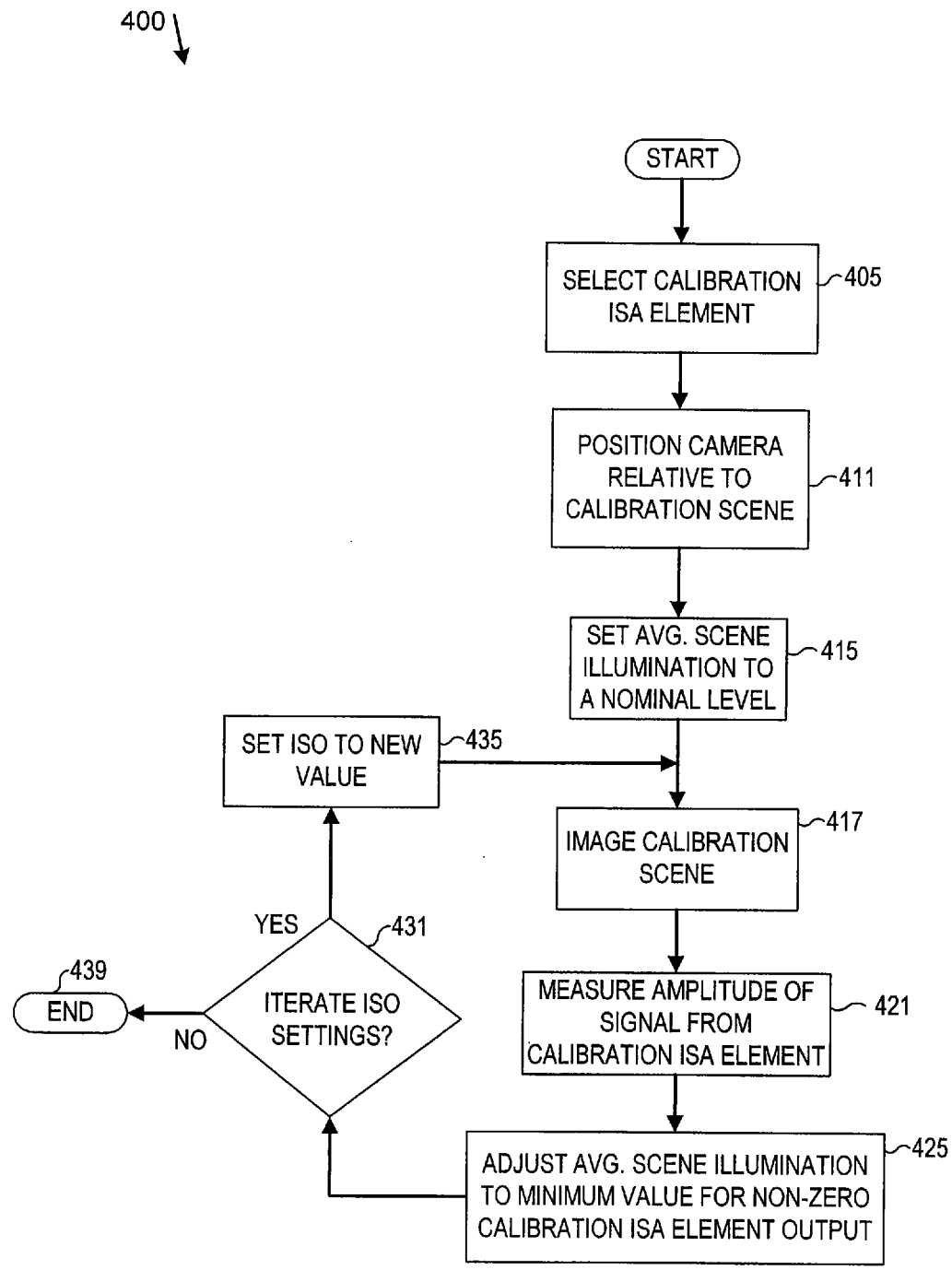
FIG. 5 is a flow diagram illustrating several calibration methods according to various embodiments of the invention.

FIG. 5 is a flow diagram illustrating several calibration methods according to various embodiments of the invention. A method 400 may utilize a calibration imaging system to image a controlled calibration scene and to derive a level of flare associated with a production imaging system of similar ISA and lens characteristics. In some embodiments, the calibration imaging system may be configured as a calibration digital camera. The illuminance associated with the optical flare incident to the ISA in the production imaging system may be proportional to a magnitude of a signal from a calibration ISA element associated with the calibration imaging system, as previously described.

The calibration scene may comprise a dark area reflecting substantially zero illuminance and a light area. The light area may create an adjustable average illuminance associated with an as-imaged version of the calibration scene. Camera exposure time may be set to a constant value (e.g., 1/60 seconds).

The method 400 may commence at block 405 with selecting the calibration ISA element from a group of ISA elements associated with the calibration imaging system. The calibration imaging system may be configured to be substantially free of unusable ISA elements that might skew the calibration results. This might occur, for example, if a darkly defective ISA element were selected as the calibration ISA element. The calibration ISA element may be selected such that a set of optical ray paths from the dark area terminate at confluent points across a surface of the group of ISA elements. In some embodiments, no output signal from any ISA element of the group of ISA elements may be lower in magnitude than the output signal from the calibration ISA element. The latter condition may prevent selection of a noisy pixel as the calibration ISA element.

The method 400 may continue at block 411 with positioning the calibration imaging system relative to the calibration scene. The calibration imaging system may be positioned such that a set of optical ray paths from the dark area terminate at confluent points across a surface of the calibration ISA element. Thus, the set of optical ray paths may provide a substantially zero illuminance to the calibration ISA element.

The method 400 may further include setting an illuminance incident to the light area to produce a nominal average scene brightness, at block 415. The method 400 may continue with imaging the calibration scene with the calibration imaging system, at block 417, and with measuring the magnitude of the signal from the calibration ISA element, at block 421. The magnitude of the signal from the calibration ISA element may be proportional to a level of flare associated with the calibration imaging system.

The method 400 may also include adjusting the illuminance incident to the light area, at block 425. The illuminance incident to the light area may be adjusted to a minimum amount of illuminance such that the adjustable average illuminance associated with the as-imaged version of the calibration scene results in a non-zero signal from the calibration ISA element. The non-zero signal from the calibration ISA element may represent a minimum level of flare associated with the calibration imaging system.

That is, the average calibration scene illuminance may be adjusted such that the calibration ISA element just begins to register a minimum level of flare produced by optics in the calibration imaging system. The threshold illuminance utilized in the method 300 above may be equal to the adjustable average illuminance associated with the as-imaged version of the calibration scene. The average calibration scene illuminance may be equal the average of pixel values in the as-imaged version of the test scene. Illuminance values associated with embodiments herein may be expressed as pixel LSB values, as previously described.

The design of the calibration imaging system may be configured to be substantially identical to a design of the production imaging system. Values of the minimum level of flare and the threshold illuminance derived using the calibration imaging system may thus be applicable to production imaging systems utilizing a substantially equivalent design, including ISA and/or optical elements. The threshold illuminance value resulting from the calibration method 400 may thus result in the reliable detection of unusable ISA elements in a production imaging system using the method 300.

Some embodiments may determine whether to repeat testing to derive values of the minimum level of flare and the threshold illuminance for individual International Standards Organization (ISO) analog gain settings, at block 431. If so, the method 400 may continue at block 435 with selecting a new ISO setting. The method 400 may then re-run the test using the new ISO setting at block 417. If individualized testing based upon ISO settings is not desired, the method 400 may terminate at block 439.

It should also be noted that the activities described herein may be executed in an order other than the order described. The various activities described with respect to the methods identified herein may also be executed in repetitive, serial, and/or parallel fashion.

A software program may be launched from a computer-readable medium in a computer-based system to execute functions defined in the software program. Various programming languages may be employed to create software programs designed to implement and perform the methods disclosed herein. The programs may be structured in an object-orientated format using an object-oriented language such as Java or C++. Alternatively, the programs may be structured in a procedure-orientated format using a procedural language, such as assembly or C. The software components may communicate using a number of mechanisms well known to those skilled in the art, such as application program interfaces or inter-process communication techniques, including remote procedure calls. The teachings of various embodiments are not limited to any particular programming language or environment.

Implementing the apparatus, systems, and methods disclosed herein may operate to identify unusable ISA elements, including clusters thereof, in a production imaging system. Unusable ISA element identification may be accomplished during post-manufacturing consumer operation, with minimal additional memory and hardware cost.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus comprising:
an image sensor array (ISA) in an imaging system;
an analog-to-digital converter (ADC) coupled to the ISA to digitize the signal from an ISA element of the ISA;
a first module coupled to the ADC to perform a black level calibration on a digitized signal from the ISA element such that the digitized signal from the ISA element corresponds to a level of zero illuminance when no light is incident to the ISA element;
a second module coupled to the ADC to normalize a digitized signal from the ISA element by removing at least one of a color cast introduced by illuminating a scene using light of a particular color temperature or a color cast introduced by a colored component of an optical flare incident to the ISA;
defect comparator to perform a comparison to compare an illuminance corresponding to the signal from the ISA element with an illuminance associated with the optical flare;
a defect location memory coupled to the defect comparator to tag the ISA element as unusable based on a result from the comparison; and
a flare calibration memory coupled to the defect comparator, the flare calibration memory to store a flare calibration value, the flare calibration value corresponding to a magnitude of a signal from a calibration ISA element associated with a calibration imaging system, wherein the flare calibration value is representative of a level of the illuminance associated with the optical flare.

2. The apparatus of claim 1, further comprising defect correction logic coupled to the defect comparator to adjust a captured image to compensate for the ISA tagged as unusable.

3. The apparatus of claim 1, wherein the ISA tagged an unusable comprises a defective ISA element.

4. The apparatus of claim 1, wherein the illuminance associated with the optical flare incident to the ISA is proportional to the magnitude of the signal from the calibration ISA element.

5. The apparatus of claim 1, further including a microcontroller unit (MCU) coupled to the defect comparator to identify an unusable ISA element.

6. The apparatus of claim 5, wherein the MCU comprises an application-specific integrated circuit.

7. The apparatus of claim 1, further comprising a lens system associated with the imaging system.

8. The apparatus of claim 1, wherein the imaging system comprises a digital camera.

9. The apparatus of claim 1, wherein the imaging system comprises a cellular telephone.

10. An apparatus comprising:
a defect comparator to compare an illuminance corresponding to a signal from an image sensor array (ISA) element in an imaging system with an illuminance associated with optical flare incident to an ISA from which the ISA element is selected;
an analog-to-digital converter (ADC) coupled to the ISA to digitize the signal from the ISA element;
a digital gain and black level adjustment module coupled to the ADC to perform a black level calibration on a digitized signal from the ISA element such that the digitized signal from the ISA element corresponds to a level of zero illuminance when no light is incident to the ISA element;
a white point correction module coupled to the ADC to normalize a digitized signal from the ISA element by removing at least one of a color cast introduced by illuminating a scene using light of a particular color temperature or a color cast introduced by a colored component of the optical flare incident to the ISA;
a defect location memory coupled to the defect comparator to tag the ISA element as unusable if the illuminance corresponding to the signal from the ISA element is less than the illuminance associated with the optical flare incident to the ISA; and
a flare calibration memory coupled to the defect comparator, the flare calibration memory to store a flare calibration value, the flare calibration value corresponding to a magnitude of a signal from a calibration ISA element associated with a calibration imaging system, wherein the flare calibration value is representative of a level of the illuminance associated with the optical flare.

11. The apparatus of claim 10, wherein the ISA tagged as unusable comprises an occluded ISA element.

12. The apparatus of claim 10, further comprising defect correction logic coupled to the defect comparator to adjust a captured image to compensate for the ISA tagged as unusable.

13. The apparatus of claim 10, further comprising a digital signal processor coupled to the defect comparator.

14. The apparatus of claim 10, wherein the illuminance associated with the optical flare incident to the ISA is proportional to the magnitude of the signal from the calibration ISA element.

15. A method comprising:
digitizing a signal from an ISA element of an ISA in an imaging system;
performing a black level calibration on a digitized signal from the ISA element such that the digitized signal from the ISA element corresponds to a level of zero illuminance when no light is incident to the ISA element;
normalizing a digitized signal from the ISA element by removing at least one of a color cast introduced by illuminating a scene using light of a particular color temperature or a color cast introduced by a colored component of an optical flare incident to the ISA;
performing a comparison to compare an illuminance corresponding to the signal from the ISA element with an illuminance associated with the optical flare, wherein a flare calibration is representative of a level of the illuminance associated with the optical flare, the flare calibration memory is stored in a flare calibration memory and corresponding to a magnitude of a signal from a calibration ISA element associated with a calibration imaging system; and tagging the ISA element as unusable based on a result from the comparison.

16. The method of claim 15, further comprising:
adjusting a captured image captured by the imaging system to compensate for the ISA tagged as unusable.

17. The method of claim 15, further comprising:
configuring the imaging system as a digital camera.

18. The method of claim 15, further comprising:
imaging a test scene, wherein an average illuminance associated with the test scene is greater than or equal to a threshold illuminance.

19. The method of claim 18, further comprising:
measuring an average illuminance associated with at least one candidate test scene; and
selecting the test scene from the at least one candidate test scene, such that the average illuminance associated with the at least one candidate test scene is greater than or equal to the threshold illuminance.

\* \* \* \* \*